(12) United States Patent
Lee et al.

(10) Patent No.: US 9,741,849 B1
(45) Date of Patent: Aug. 22, 2017

(54) INTEGRATED CIRCUITS RESISTANT TO ELECTROSTATIC DISCHARGE AND METHODS FOR PRODUCING THE SAME

(71) Applicant: Globalfoundries Singapore Pte. Ltd., Singapore (SG)

(72) Inventors: Chien-Hsin Lee, Singapore (SG); Mahadeva Iyer Natarajan, Singapore (SG); Xiangxiang Lu, Singapore (SG); Tsung-Che Tsai, Singapore (SG); Manjunatha Prabhu, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/094,635

(22) Filed: Apr. 8, 2016

(51) Int. Cl.
| | |
|---|---|
| *H01L 21/336* | (2006.01) |
| *H01L 21/02* | (2006.01) |
| *H01L 29/78* | (2006.01) |
| *H01L 29/66* | (2006.01) |
| *H01L 27/02* | (2006.01) |

(52) U.S. Cl.
CPC ...... *H01L 29/7835* (2013.01); *H01L 27/0251* (2013.01); *H01L 29/66659* (2013.01)

(58) Field of Classification Search
CPC .................................................. H01L 29/7835
USPC .................. 257/344, 336; 438/289, 179, 159
See application file for complete search history.

(56) References Cited

U.S. PATENT DOCUMENTS

| | | | |
|---|---|---|---|
| 5,614,755 A * | 3/1997 | Hutter ................ | H01L 21/8249 257/471 |
| 6,573,562 B2 * | 6/2003 | Parthasarathy ....... | H01L 21/761 257/299 |
| 7,608,907 B2 | 10/2009 | Mallikarjunaswamy | |
| 8,816,476 B2 * | 8/2014 | Mallikarjunaswamy | H01L 29/4175 257/621 |

* cited by examiner

*Primary Examiner* — Calvin Lee
(74) *Attorney, Agent, or Firm* — Lorenz & Kopz, LLP

(57) ABSTRACT

Integrated circuits and methods of producing such integrated circuits are provided. In an exemplary embodiment, an integrated circuit includes a heavily doped source area having conductivity determining impurities at a heavily doped source concentration and a lightly doped drain area having conductivity determining impurities at a lightly doped drain concentration less than the heavily doped source concentration. A drain conductor directly contacts the lightly doped drain area, and a channel is positioned between the heavily doped source area and the lightly doped drain area. A gate overlies the channel.

17 Claims, 6 Drawing Sheets

US 9,741,849 B1

INTEGRATED CIRCUITS RESISTANT TO ELECTROSTATIC DISCHARGE AND METHODS FOR PRODUCING THE SAME

TECHNICAL FIELD

The technical field generally relates to integrated circuits capable of withstanding electrostatic discharges and methods of producing the same, and more particularly relates to integrated circuits with high voltage transistors that are resistant to electrostatic discharge damage and methods of producing the same.

BACKGROUND

Many electronic components within integrated circuits are sensitive to electrostatic discharge (ESD) and other forms of voltage spikes. An ESD event is a sudden flow of electricity between two or more objects. The electrical flow can be initiated in several ways, such as electrical contact, a short, or a dielectric breakdown. The static electricity developed by walking across a carpet can be enough to damage some devices, where static electricity often has very high voltage. In many cases, an ESD event will damage or destroy one or more electronic components in an integrated circuit, and ESD events are common.

Various techniques are used to prevent electronic component damage due to ESD events. For example, manufacturers may utilize electrostatic protective areas that are essentially free of static electricity. This can involve several measures, such as avoiding the use of highly charging materials, grounding objects and/or workers, and controlling humidity. Many integrated circuits are transported in special containers that help prevent damage from ESD events, such as anti-static bags that include partially conductive plastics or other conductive materials. However, it may be difficult or impossible to prevent ESD events for integrated circuits in use. For example, an integrated circuit included in a motor vehicle is exposed to many different conditions with the motor vehicle, so prevention of ESD events is difficult. Some integrated circuits include design features to protect electronic components, but such protection has limits.

Accordingly, it is desirable to provide integrated circuits with electronic components that are capable of withstanding sudden flows of electricity without damage, and methods of producing the same. In addition, it is desirable to provide integrated circuits with high voltage transistors that are resistant to ESD damage, and methods of producing the same. Furthermore, other desirable features and characteristics of the present embodiment will become apparent from the subsequent detailed description and the appended claims, taken in conjunction with the accompanying drawings and this background of the invention.

BRIEF SUMMARY

Integrated circuits and methods of producing such integrated circuits are provided. In an exemplary embodiment, an integrated circuit includes a heavily doped source area having conductivity determining impurities at a heavily doped source concentration and a lightly doped drain area having conductivity determining impurities at a lightly doped drain concentration less than the heavily doped source concentration. A drain conductor directly contacts the lightly doped drain area, and a channel is positioned between the heavily doped source area and the lightly doped drain area. A gate overlies the channel.

An integrated circuit is provided in another embodiment. The integrated circuit includes a heavily doped source area with conductivity determining impurities, and a lightly doped drain area with conductivity determining impurities. The lightly doped drain area is configured for ambipolar electrical conduction. A channel is positioned between the heavily doped source area and the lightly doped drain area, and a gate overlies the channel.

A method of producing an integrated circuit is provided in yet another embodiment. The method includes implanting conductivity determining impurities into a substrate at a concentration of from about $1\times10^{14}$ to about $1\times10^{15}$ per cubic centimeter to form a lightly doped drain area, where the lightly doped drain area has a maximum drain concentration of conductivity determining impurities of about $1\times10^{15}$. Conductivity determining impurities are implanted into the substrate at a concentration of from about $1\times10^{18}$ to about $1\times10^{21}$ per cubic centimeter to form a heavily doped source area. The heavily doped source area is separated from the lightly doped drain area by a channel, and a gate is formed overlying the channel. A drain conductor is formed in direct contact with the lightly doped drain area.

BRIEF DESCRIPTION OF THE DRAWINGS

The present embodiments will hereinafter be described in conjunction with the following drawing figures, wherein like numerals denote like elements, and wherein.

DETAILED DESCRIPTION

The following detailed description is merely exemplary in nature and is not intended to limit the various embodiments or the application and uses thereof. Furthermore, there is no intention to be bound by any theory presented in the preceding background or the following detailed description. Embodiments of the present disclosure are generally directed to integrated circuits and methods for fabricating the same. The various tasks and process steps described herein may be incorporated into a more comprehensive procedure or process having additional steps or functionality not described in detail herein. In particular, various steps in the manufacture of integrated circuits are well-known and so, in the interest of brevity, many conventional steps will only be mentioned briefly herein or will be omitted entirely without providing the well-known process details.

Figure 1:
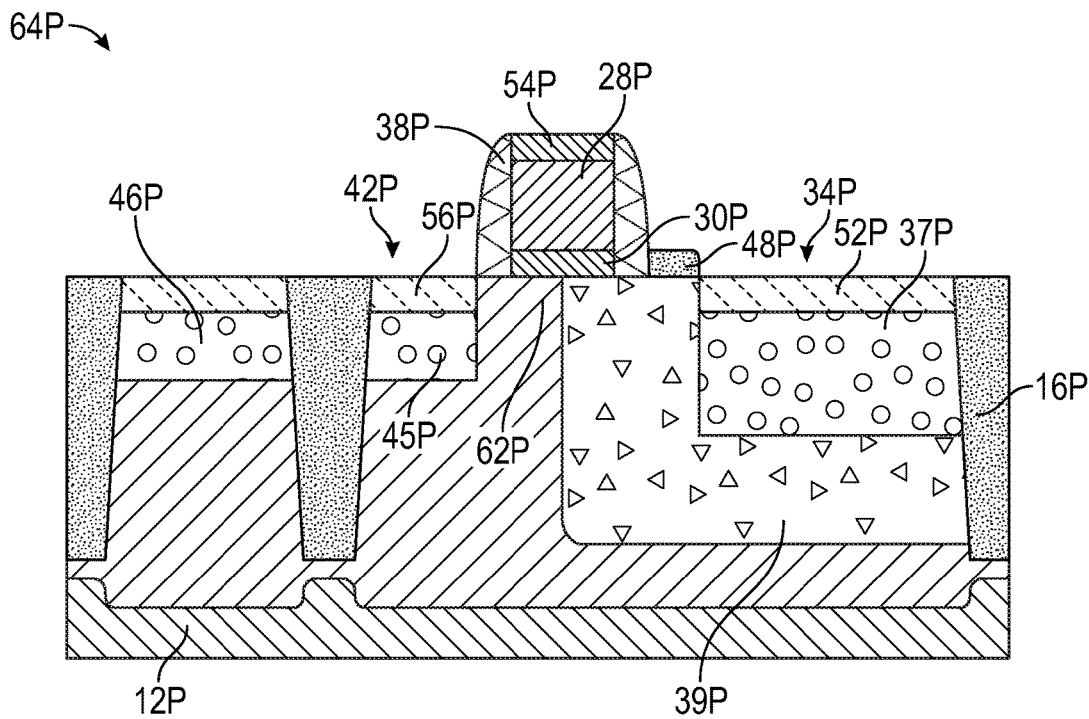
FIG. 1 illustrates a prior art transistor in a cross sectional view.

An exemplary embodiment of a prior art high voltage MOSFET transistor 64P is illustrated in FIG. 1. The prior art high voltage MOSFET transistor 64P includes a substrate 12P, a plurality of shallow trench isolations 16P, and a gate 28P overlying a gate dielectric 30P that in turn overlies a channel 62P. Spacers 38P are positioned on opposite sides of the gate 28P and the gate dielectric 30P, and a gate conductor 54P overlies the gate 28P. A source 42P and a drain 34P are positioned on opposite sides of the channel 62P, where the source 42P includes a source conductor 56P and a heavily doped source area 45P. The drain 34P includes a drain conductor 52P overlying and electrically connected to a heavily doped drain area 37P. A silicide blocking layer 48P is positioned between the drain conductor 52P and the spacer 38P such that the distance between the spacer 38P and the drain conductor 52P is increased. A lightly doped drain area 39P is around the drain conductor 52P and the heavily doped drain area 37P, so the drain conductor 52P and the heavily doped drain area 37P do not directly contact the channel 62P. Many high voltage MOSFET transistors 64P include a lightly doped drain area 39P, and may include a lightly doped source area (not illustrated) in some embodiments. A P-well base 46P may be adjacent to the prior art transistor 64P in some embodiments. The features mentioned above will be described in greater detail below.

Figure 2:
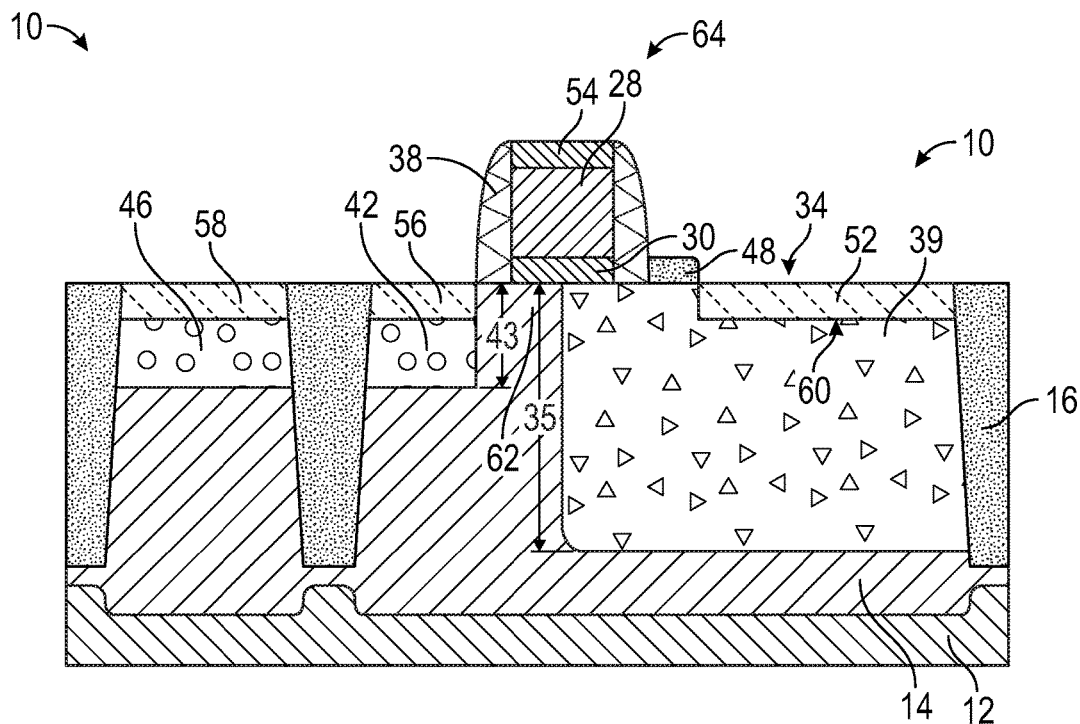
FIG. 2 illustrates an exemplary embodiment of a transistor in a cross sectional view.

Reference is now made to an exemplary embodiment in FIG. 2 with continuing reference to FIG. 1. In this embodiment, the drain 34 includes a drain conductor 52 and a lightly doped drain area 39, but the drain 34 does not include the heavily doped drain area 37P of the prior art in FIG. 1. The lightly doped drain area 39 of the currently described transistor 64 is typically used in high voltage devices, as mentioned above. The drain conductor 52 directly contacts the lightly doped drain area 39, and this forms a Schottky barrier where the very electrically conductive drain conductor 52 contacts the lightly doped drain area 39. The drain conductor 52 of the Schottky barrier does not directly contact the channel 62, because the drain conductor 52 is separated from the channel 62 by the lightly doped drain area 39. As such, the drain conductor 52 is separated from the channel 62 by at least a portion of the lightly doped drain area 39. This description contemplates variations of the current transistor 64 illustrated in FIG. 2, such as a transistor 64 with two sources 42 and two gates 28 on opposite sides of the drain 34 (not illustrated), and other variations.

The current Schottky MOSFET transistor 64 forms a "pnpn" structure, similar to a silicon controlled rectifier, and such structures are known for good performance with electrostatic discharges. In fact, current comparisons between the prior art transistor 64P illustrated in FIG. 1 and the current transistor 64 illustrated in FIG. 2 show the current transistor 64 illustrated in FIG. 2 can withstand electrical currents significantly higher than the prior art transistor 64P illustrated in FIG. 1. In an exemplary embodiment, the current transistor 64 illustrated in FIG. 2 can withstand more than 100 times the amperage of the prior art transistor 64P illustrated in FIG. 1 prior to breakdown. Furthermore, some embodiments of the current transistor 64 illustrated in FIG. 2 can withstand more voltage than the prior art transistor 64P illustrated in FIG. 1 prior to breakdown.

An exemplary manufacturing process for the current transistor 64 illustrated in FIG. 2 is provided below, where all references to the transistor 64 and various components below are for the current transistor 64 illustrated in FIG. 2 unless specific reference is made to the prior art. The manufacturing process described below includes greater specificity and a more detailed description for the various components briefly mentioned above as well as for other components.

Figure 3:
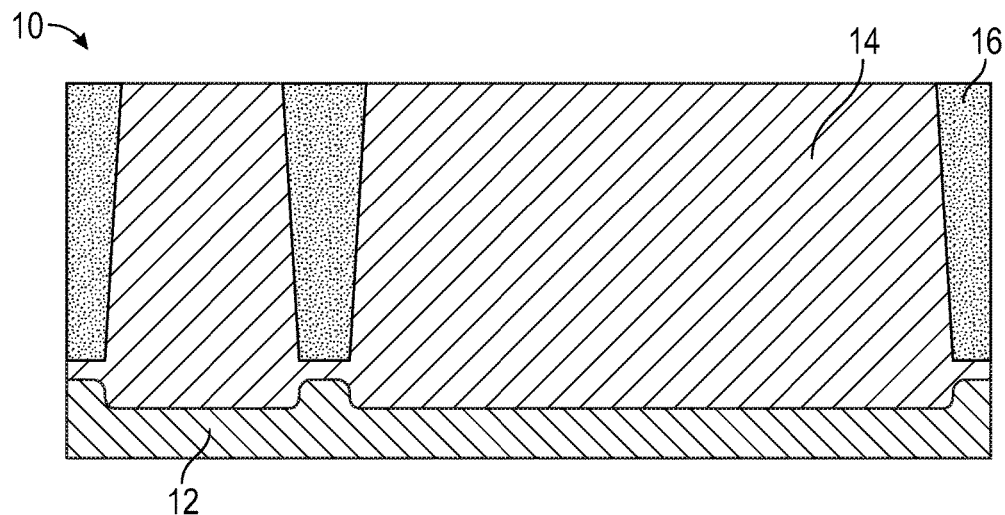
FIGS. 3-11 illustrate, in cross sectional views, an integrated circuit and methods for fabricating the same in accordance with exemplary embodiments.

Referring to an exemplary embodiment illustrated in FIG. 3, an integrated circuit 10 includes the substrate 12, where the substrate 12 includes semiconductor material. As used herein, the term "semiconductor material" will be used to encompass semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. In addition, "semiconductor material" encompasses other materials such as relatively pure and impurity-doped germanium, gallium arsenide, zinc oxide, glass, and the like. In many embodiments, the substrate 12 primarily includes a monocrystalline semiconductor material. The substrate 12 may be a bulk silicon wafer (as illustrated) or may be a thin layer of silicon on an insulating layer (commonly known as silicon-on-insulator or SOI, not illustrated) that, in turn, is supported by a carrier wafer.

In an exemplary embodiment, the substrate 12 includes a P-well 14, but in alternate embodiments the substrate 12 may include an N-well in place of the P-well 14, and in yet other embodiments there is not an N or a P-well. This description will describe the manufacture of an N type electronic component, but it is to be understood that a P type electronic component may be manufactured using similar processes. The concentrations of conductivity determining impurities described herein for the N type electronic component are the same as for a comparable P type electronic component, with the exception that the type of conductivity determining impurity is different for each type of electronic component, so the described concentrations will not be repeated for both types of electronic components. The P-well 14 includes P type conductivity determining impurities at a P-well concentration, where the P-well concentration may be from about $1 \times 10^{15}$ to about $1 \times 10^{16}$ per cubic centimeter. The P-well concentration refers to the concentration of conductivity determining impurities within the P-well 14. "N" type conductivity determining impurities include arsenic or phosphorous, but antimony, other materials, or combinations thereof can also be used, and different components may be implanted with the same or different N type conductivity determining impurities in various embodiments. "P" type conductivity determining impurities include boron, aluminum, gallium, and indium, but other materials or combinations of materials can also be used, and different components may be implanted with the same or different "P" type conductivity determining impurities in various embodiments.

One or more shallow trench isolations 16 may optionally be positioned within the substrate 12 in some embodiments. The shallow trench isolations 16 are an electrically insulating material, and may include silicon dioxide in some embodiments. As used herein, an "electrically insulating material" is a material with a resistivity of about $1 \times 10^4$ ohm meters or more, an "electrically conductive material" is a material with a resistivity of about $1 \times 10^{-4}$ ohm meters or less, and an "electrically semiconductive material" is a material with a resistivity of from more than about $1 \times 10^{-4}$ ohm meters to less than about $1 \times 10^4$ ohm meters. The P-well 14 may extend under one or more of the shallow trench isolations 16, as illustrated in FIG. 1, but the P-well 14 may not extend under some other shallow trench isolations 16. In many embodiments, the substrate 12 as a whole is provided with some conductivity determining impurities, such as at a substrate concentration of about $10^{13}$ to about $10^{18}$ per cubic centimeter. The P-well 14 may be used in a substrate 12 that includes N type conductivity determining impurities, and there may not be a P-well 14 in embodiments with a substrate that includes P type conductivity determining impurities.

Figure 4:
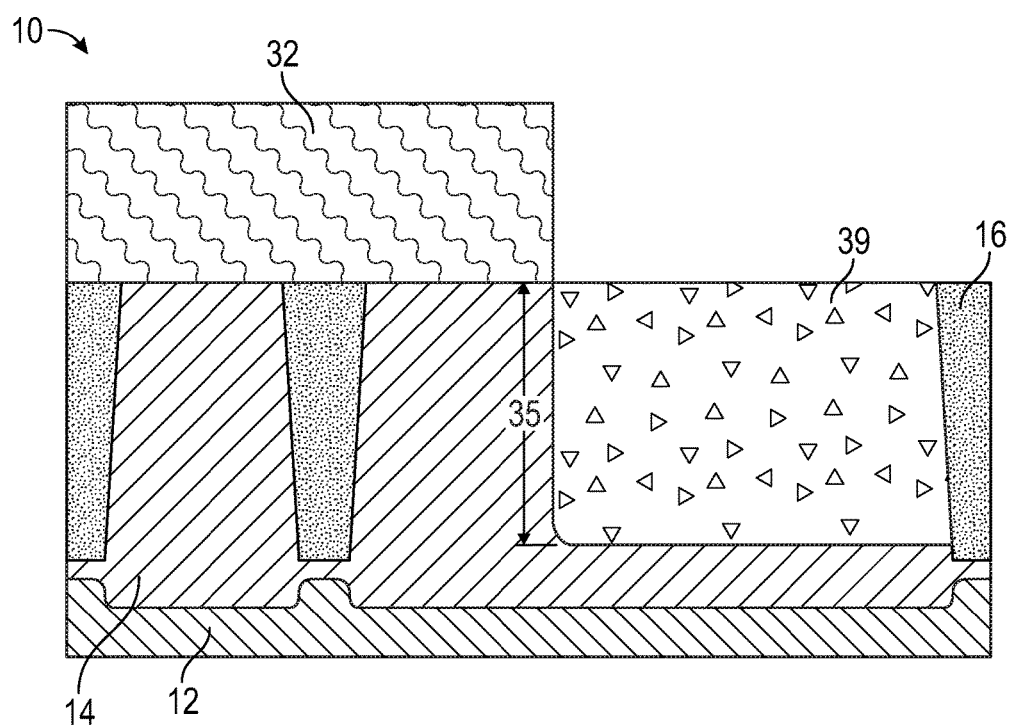

A drain photoresist 32 may be formed and patterned overlying the substrate 12 to expose an area of the substrate 12, as illustrated in an exemplary embodiment in FIG. 4. The drain photoresist 32 (and other photoresist layers described below) may be deposited by spin coating, and patterned by exposure to light or other electromagnetic radiation through a mask with transparent sections and opaque sections. The light causes a chemical change in the photoresist such that either the exposed portion or the non-exposed portion can be selectively removed. The desired locations may be removed with an organic solvent, and the drain photoresist 32 remains overlying the other areas of the substrate 12. The drain photoresist 32 (and other photoresist layers described below) may optionally include a top and/or bottom anti-reflective coating (not illustrated) and/or a hard mask (not illustrated). Many anti-reflective coatings are available, including inorganic and organic compounds, such as titanium nitride or organosiloxanes. Titanium nitride may be deposited by chemical vapor deposition using tetramethylamidotitanium and nitrogen trifluoride, and organosiloxanes may be deposited by spin coating. Anti-reflective coatings may improve the accuracy and critical dimensions during photoresist patterning. The hard mask (not illustrated)(and other hard masks associated with other photoresist layer described below) may include silicon nitride, where silicon nitride can be formed by low pressure chemical vapor deposition using ammonia and dichlorosilane. Other materials or formation techniques may be used for a hard mask in alternate embodiments. Portions of the hard mask are exposed by removal of selected portions of the drain photoresist 32. The exposed portions of the hard mask may be removed with a wet etch using hot phosphoric acid in some embodiments. The drain photoresist 32 (and other photoresist layers described below) may be removed after use, such as with an oxygen containing plasma.

The exposed area of the P-well 14 and/or substrate 12 may be adjacent to or include one or more of the shallow trench isolations 16 in some embodiments. Conductivity determining impurities are implanted into the substrate 12, including the P-well 14 in some embodiments, to form a lightly doped drain area 39. The conductivity determining impurities may be implanted in a variety of manners. Thermal diffusion or ion implantation may be used in some embodiments. The conductivity determining impurity may be placed on or just within the substrate 12 and then diffused into the substrate 12 with heat for thermal diffusion, and ions may be implanted into the substrate 12 under the influence of an electrical field in ion implantation. The conductivity determining impurities are implanted into the lightly doped drain area 39 at a lightly doped drain concentration, such as a lightly doped drain concentration of from about $1\times10^{14}$ to about $1\times10^{15}$ per cubic centimeter. The lightly doped drain concentration may be from about $1\times10^{13}$ to about $1\times10^{15}$ or from about $1\times10^{13}$ to about $1\times10^{18}$ in alternate embodiments. The lightly doped drain concentration is such that the lightly doped drain area 39 is an electrically semiconductive material in some embodiments. In an exemplary embodiment, the conductivity determining impurities are N type conductivity determining impurities, but P type conductivity determining impurities are used in alternate embodiments. The lightly doped drain area 39 has a drain depth 35, where the drain depth 35 may be from about 10 to about 300 nanometers, or from about 20 to about 200 nanometers, or from about 30 to about 100 nanometers in various embodiments. The lightly doped drain area 39 also has a lightly doped drain volume, such as a lightly doped drain volume of from about 10 to about 1,000 cubic micrometers, or from about 10 to about 500 cubic micrometers or from about 20 to about 300 cubic micrometers in alternate embodiments.

Figure 5:
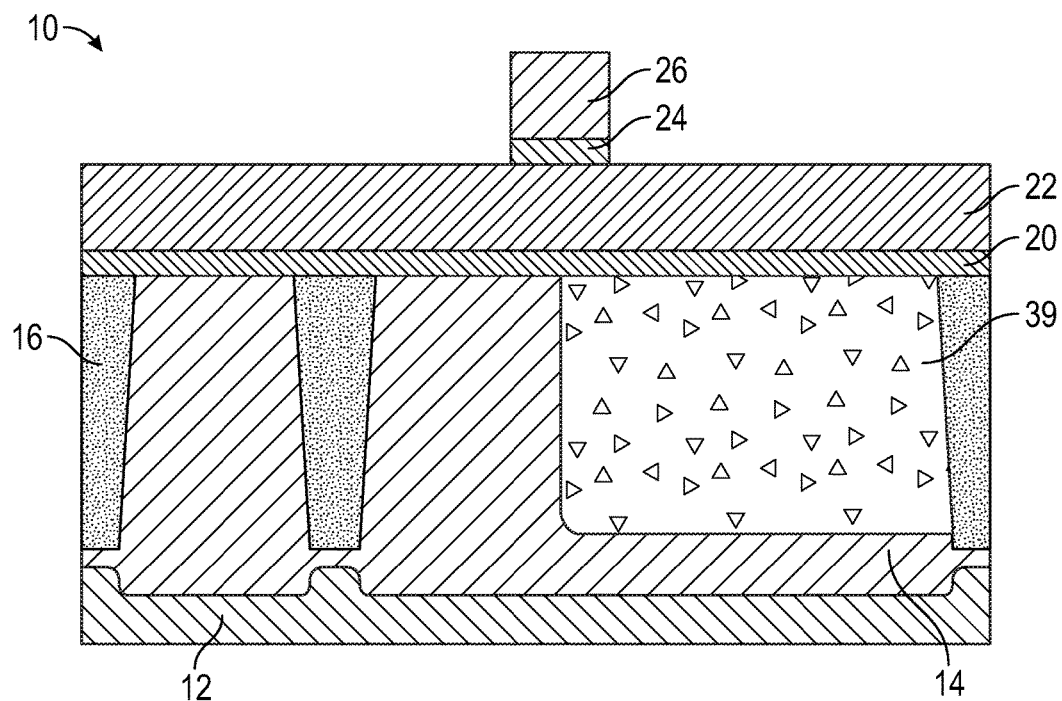

A gate insulator layer 20 may be formed overlying the substrate 12, the P-well 14 (if present), the lightly doped drain area 39, and the shallow trench isolations 16 (if present), as illustrated in an exemplary embodiment in FIG. 5. As used herein, the term "overlying" means "over" such that an intervening layer may lie between the gate insulator layer 20 and the substrate 12, or "on" such that the gate insulator layer 20 physically contacts the substrate 12. Moreover, the term "directly overlying" means a vertical line passing through the upper component also passes through the lower component, such that at least a portion of the upper component is directly over at least a portion of the lower component. It is understood that the integrated circuit 10 may be moved such that the relative "up" and "down" positions change, so reference to a "vertical" line means a line that is about perpendicular to a surface of the substrate 12. The gate insulator layer 20 may be an electrically insulating material, such as silicon dioxide. Silicon dioxide may be formed by chemical vapor deposition using silane and oxygen, but other techniques and/or materials may be used to form the gate insulator layer 20 in alternate embodiments.

A gate layer 22 may be formed overlying the gate insulator layer 20. The gate layer 22 may be polysilicon in an exemplary embodiment, where polysilicon can be formed by low pressure chemical vapor deposition in a silane ambient, but other techniques or materials can be used in alternate embodiments. A gate hard mask 24 and a gate photoresist 26 may be formed and patterned overlying the gate layer 22. The gate hard mask 24 may include silicon nitride in some embodiments, as described above for hard mask layers. Portions of the gate hard mask 24 are exposed by removal of selected portions of the gate photoresist 26. The exposed portions of the gate hard mask 24 may be removed with a wet etch using hot phosphoric acid in some embodiments.

Figure 6:
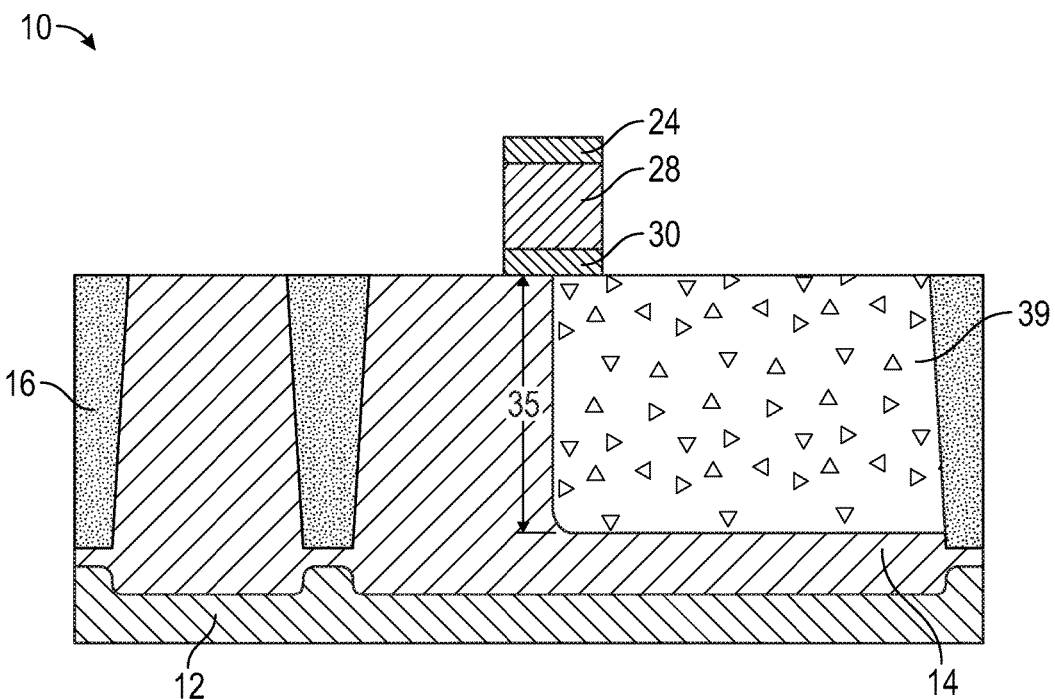

Referring to an exemplary embodiment illustrated in FIG. 6, with continuing reference to FIG. 5, the gate layer 22 and the gate insulator layer 20 may be removed from areas that are exposed by the patterning of the gate hard mask 24 and gate photoresist 26 layers to form a gate 28 and a gate dielectric 30. The gate layer 22 may be removed with a reactive ion etch using hydrogen bromide in embodiments where the gate layer 22 primarily includes polysilicon, and the gate insulator layer 20 may be removed with a wet etch using dilute hydrofluoric acid in embodiments where the gate insulator layer 20 primarily includes silicon dioxide. A portion of the gate hard mask 24 may remain overlying the gate 28 in some embodiments. The gate 28 and the gate dielectric 30 may be positioned over a portion of the lightly doped drain area 39, such that at least a portion of the lightly doped drain area 39 directly underlies the gate 28. However, at least a portion of the gate 28 overlies the P-well 14 and/or substrate 12, so some of the gate 28 does not directly overlie the lightly doped drain area 39.

Figure 7:
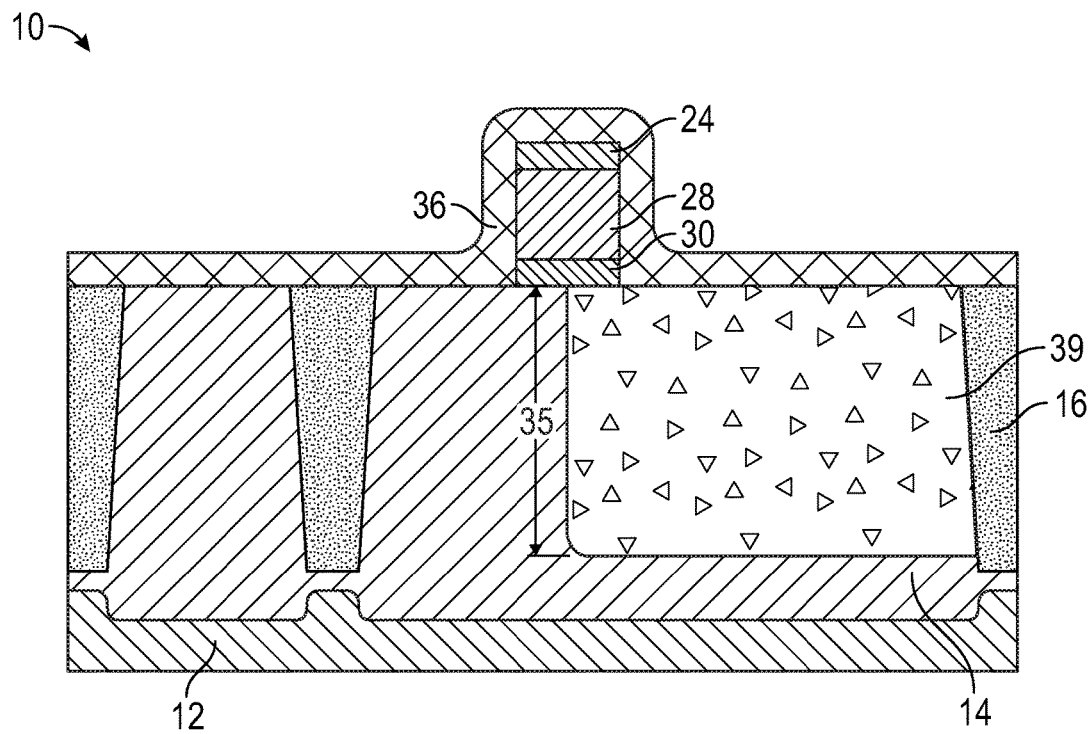
Figure 8:
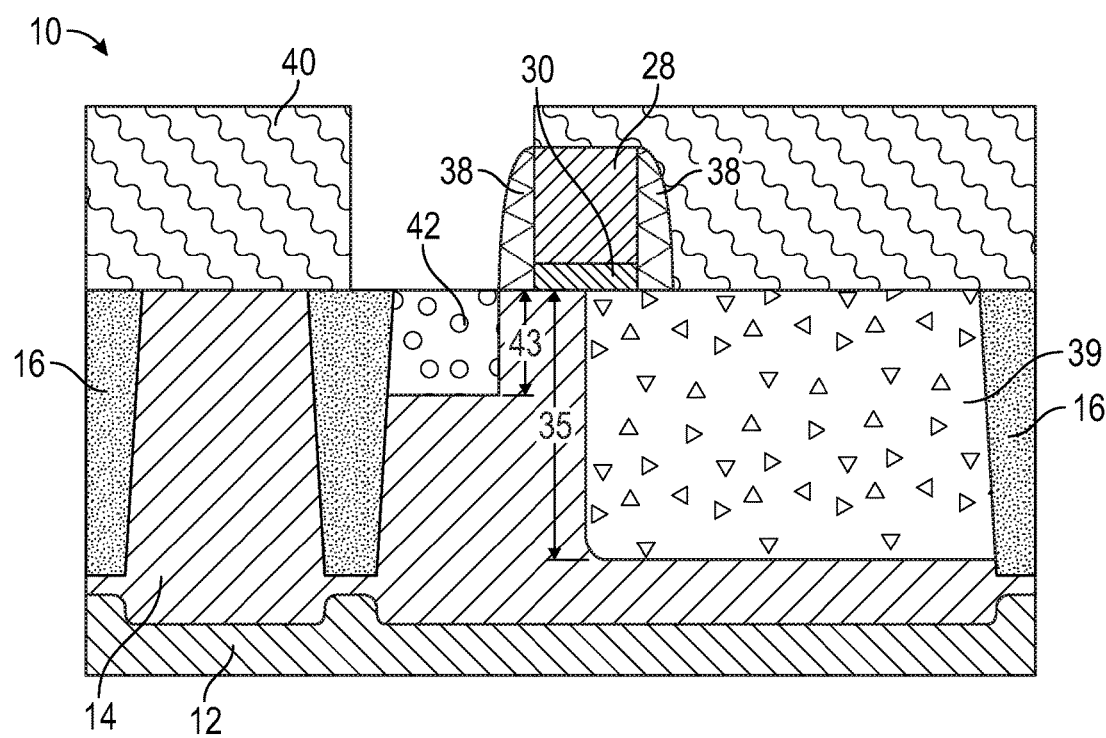

A spacer layer 36 may be formed overlying the substrate 12 and the gate 28, as illustrated in an exemplary embodiment in FIG. 7. The spacer layer 36 may include silicon nitride, which can be formed by low pressure chemical vapor deposition using ammonia and dichlorosilane. Spacers 38 may then be formed adjacent to the gate 28 by anisotropically etching the spacer layer 36, such as with a reactive ion etch using hydrogen and nitrogen trifluoride, as illustrated in an exemplary embodiment in FIG. 8 with continuing reference to FIG. 7. The gate hard mask 24 that remained on the gate 28 may be removed while forming the spacers 38 in some embodiments. A source photoresist 40 may then be formed and patterned to expose a portion of the substrate 12 adjacent to the gate 28 and on the opposite side of the gate 28 as the lightly doped drain area 39. Conductivity determining impurities are then implanted into the substrate 12 to form a heavily doped source area 45 having a heavily doped source concentration of conductivity determining impurities, as described above for the lightly doped drain area 39. The heavily doped source concentration is greater than the lightly doped drain concentration in an exemplary embodiment, where the heavily doped source concentration may be from about $1\times10^{18}$ to about $1\times10^{21}$ per cubic centimeter in some embodiments. The heavily doped source concentration may be from about $1\times10^{19}$ to about $1\times10^{21}$, or from about $1\times10^{20}$ to about $1\times10^{21}$ in alternate embodiments. In some embodiments, a maximum drain concentration for the lightly doped drain area 39 is less than a minimum source concentration for the heavily doped source area 45, such as a maximum lightly doped drain concentration of about $1\times10^{15}$ per cubic centimeter. The heavily doped source concentration may be such that the heavily doped source area 45 is an electrically conductive material. The heavily doped source area 45 is implanted with N type conductivity determining impurities in an exemplary embodiment, but P type conductivity determining impurities may be used in alternate embodiments. The heavily doped source area 45 and lightly doped drain area 39 are implanted with the same type of conductivity determining impurities in many embodiments, and the same conductivity determining impurity may be used for both the heavily doped source area 45 and the lightly doped drain area 39 in some embodiments.

The heavily doped source area 45 has a heavily doped source volume that is less than the lightly doped drain volume in some embodiments, and the heavily doped source volume may be from about 10 to about 100 cubic micrometers, or from about 5 to about 300 cubic micrometers, or from about 1 to about 500 cubic micrometers in alternate embodiments. The heavily doped source area 45 may optionally be adjacent to a shallow trench isolation 16. The heavily doped source area 45 also has a source depth 43 that is less than the drain depth 35, where the source depth 43 may be from about 0.1 to about 0.9 times the drain depth 35, or from about 0.2 to about 0.7 times the drain depth 35, or from about 0.3 to about 0.6 times the drain depth 35 in various embodiments. The spacer 38 may influence the positioning of the conductivity determining ions such that no part of the heavily doped source area 45 directly underlies the gate 28.

Figure 9:
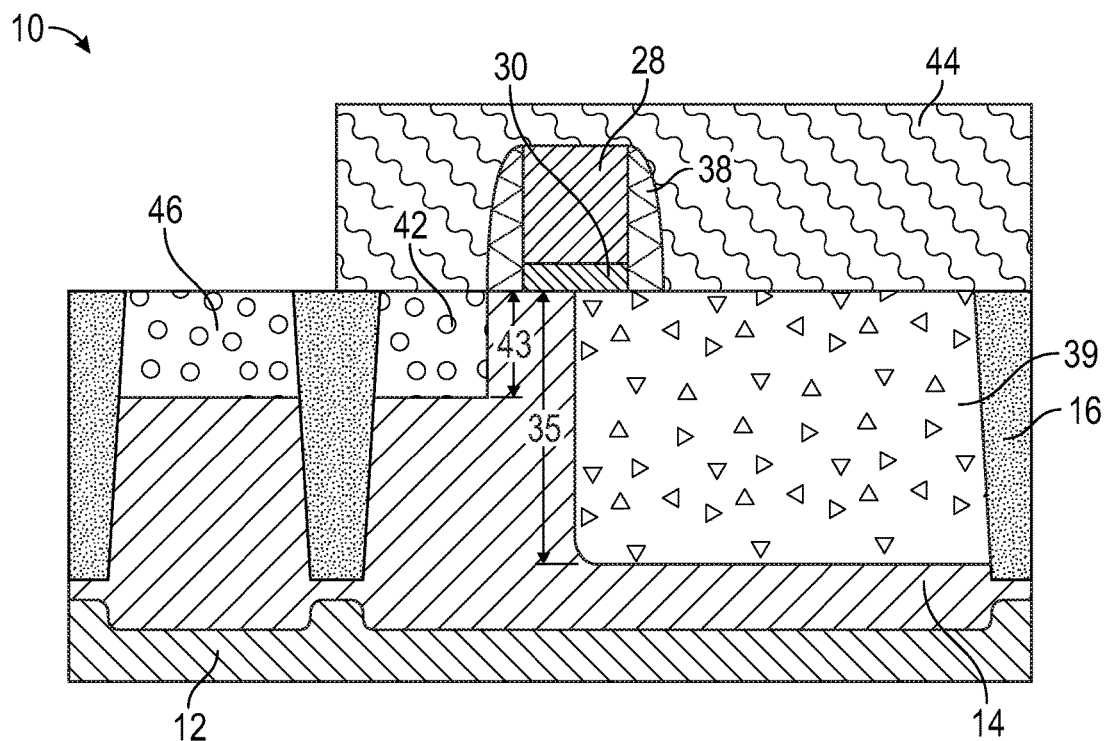

Reference is made to the exemplary embodiment illustrated in FIG. 9. A P-well base photoresist 44 is formed overlying the substrate 12, and the P-well base photoresist 44 may be patterned to expose a portion of the P-well 14. Conductivity determining impurities may then be implanted into the P-well 14 to form a P-well base 46, as described above for the heavily doped source area 45 and lightly doped drain area 39. The P-well base 46 includes P type conductivity determining impurities at a P-well base concentration of from about $1\times10^{16}$ to about $1\times10^{19}$ per cubic centimeter in an exemplary embodiment. The P-well base concentration may be from about $1\times10^{16}$ to about $1\times10^{20}$, or from about $1\times10^{16}$ to about $1\times10^{21}$ in alternate embodiments. In embodiments where the P-well 14 is replaced by an N-well (not illustrated), the P-well base 46 is replaced with an N-well base (not illustrated). The P-well base 46 may be in electrical communication with the heavily doped source area 45 (electrical communication not illustrated).

Figure 10:
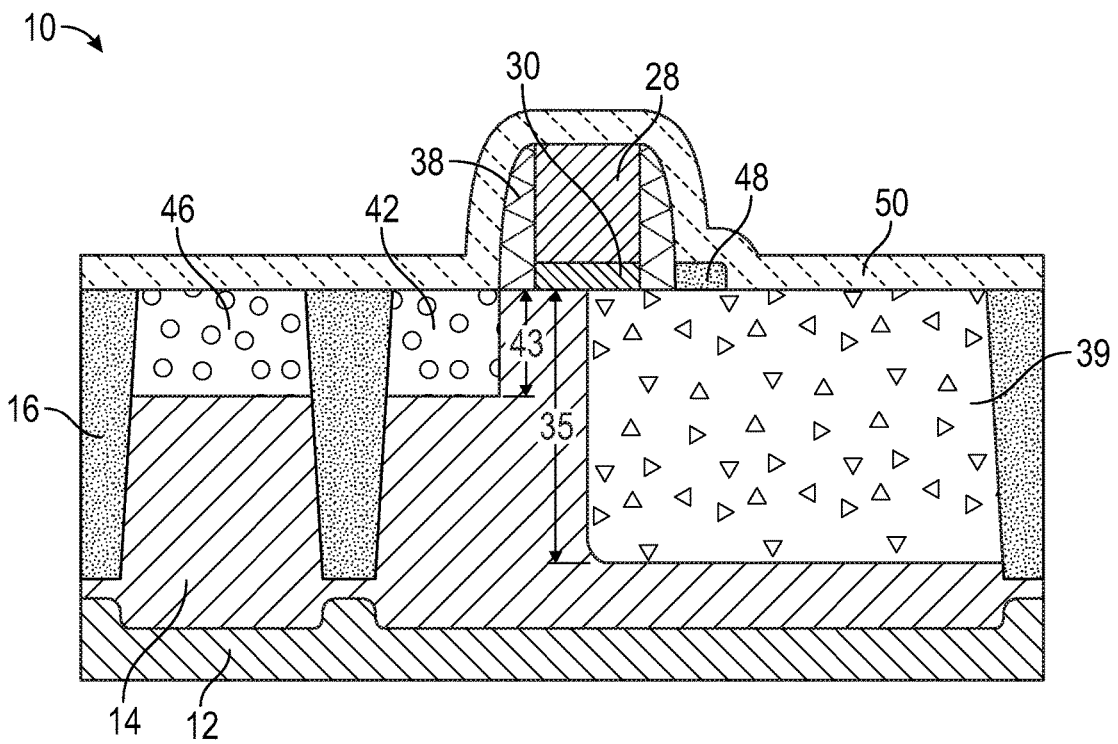
Figure 11:
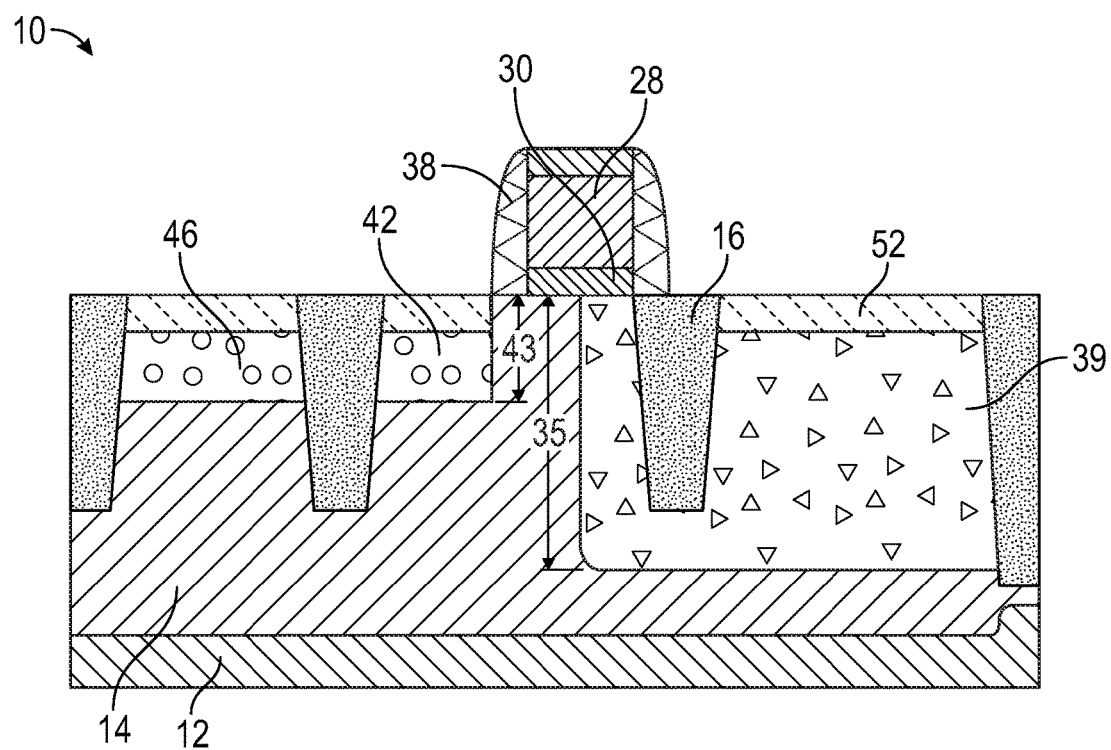

A siliciding process may follow formation of the gate 28, the heavily doped source area 45, the lightly doped drain area 39, and the optional P-well base 46, as illustrated in an exemplary embodiment in FIG. 10. The siliciding process may include several steps, including cleaning, depositing a metal layer 50, and then annealing to form metal silicides. In some embodiments, a silicide blocking layer 48 may be formed overlying the lightly doped drain area 39 and adjacent to one of the spacers 38. The silicide blocking layer 48 may be positioned with photoresist (not illustrated), and may include silicon dioxide of other electrically insulating materials. In alternate embodiments, a shallow trench isolation may be used in place of or in addition to the silicide blocking layer 48, where the silicide blocking layer 48 and/or the shallow trench isolation effectively increase the distance between the drain conductor 52 and the gate 28, including the substrate 12 and/or P-well 14 underlying the gate 28, as is typical for high voltage devices. FIG. 11 illustrates an embodiment with a shallow trench isolation 16 that increases the distance between the drain conductor 52 and the source 42 after the silicides are formed. The siliciding process may be the same as that used for other MOSFET transistors in some embodiments. The exposed surfaces may be cleaned with an organic solution followed by a dilute hydrofluoric acid solution, and then rinsed with deionized water and dried. Other cleaning embodiments are also possible, such as dipping the integrated circuit 10 in dilute hydrofluoric acid, followed by a drying step. The integrated circuit 10 is then optionally placed in a metal deposition chamber, and further cleaned with sputtered argon ions. A thin metal layer 50 may then be deposited on the exposed surfaces, such as by sputtering or chemical vapor deposition. Several different metals can be deposited for the siliciding process, such as nickel (Ni), titanium (Ti), or cobalt (Co). After the metal layer 50 is deposited, metal silicides are formed by thermal annealing, as illustrated in FIG. 2 with continuing reference to FIG. 10. Annealing temperatures of about 100 degrees Celsius (° C.) to about 700° C. are used in some embodiments, and the annealing temperature is selected based on the metal used. In an exemplary embodiment using nickel (Ni), a two-step anneal may be used. The first annealing step uses temperatures from about 240° C. to about 320° C. for about 10 to about 40 seconds, and this step defines the diffusion of the Ni into the silicon material. A second annealing step is used to convert the silicon and nickel to a stable nickel-silicide phase with specific resistance values. The second annealing step may use temperatures of from about 400° C. to about 500° C. for about 20 to about 40 seconds. However, in some embodiments ultrashort laser anneals are used The metal layer 50 reacts with silicon to form a metal silicide, as illustrated in FIG. 2 with continuing reference to FIG. 10, but the metal layer 50 does not react with the dielectrics or other materials. Wet etching may be used to remove the metal layer 50 from areas where a metal silicide was not formed and also any remaining metal that did not diffuse into the silicon material. For example, nickel can be selectively etched with a mixture of nitric acid, acetic acid, and sulfuric acid. Cobalt can be selectively etched with a mixture of hydrochloric acid and peroxide. Titanium can be selectively etched with a mixture of ammonia and peroxide. Many other etchants can be used in various embodiments. The metal silicide formed from available silicon in the lightly doped drain area 39 is referred to herein as the drain conductor 52, and the silicide blocking layer 48 may be used to increase the distance between the drain conductor 52 and the gate, as is typical for high voltage devices. In a similar manner the metal silicides formed in the gate 28, the heavily doped source area 45, and the optional P-well base 46 form a gate conductor 54, a source conductor 56, and a P-well base conductor 58, respectively. The drain conductor 52, the gate conductor 54, the source conductor 56, and the optional P-well base conductor 58 are all electrically conductive in an exemplary embodiment. In the illustrated embodiment, a source 42 is formed by the source conductor 56 and the heavily doped source area 45, but the source 42 may include a lightly doped source area (not illustrated) in other embodiments. A drain 34 is formed by the drain conductor 52 and the lightly doped drain area 39, but the drain 34 does not include a heavily doped drain area.

The drain conductor 52 includes a drain semiconductor surface 60, where the drain semiconductor surface 60 is the surface of the drain conductor 52 that physically contacts semiconductor material. As such, the drain semiconductor surface 60 may include the entire surface of the drain conductor 52 that directly contacts the lightly doped drain area 39, and no portion of the drain conductor 52 may physically contact a heavily doped drain area (not illustrated). In an exemplary embodiment, all portions of the lightly doped drain area 39 that directly contact the drain semiconductor surface 60 have a maximum concentration of conductivity determining impurities of about $1 \times 10^{15}$ per cubic centimeter. In alternate embodiments, all portions of the lightly doped drain area 39 that directly contact the drain semiconductor surface 60 have a lightly doped drain concentration of conductivity determining impurities of from about $1 \times 10^{14}$ to about $1 \times 10^{15}$ per cubic centimeter, or from about $1 \times 10^{13}$ to about $1 \times 10^{15}$. All portions of the lightly doped drain area 39 that directly contact the drain semiconductor surface 60 have a lower lightly doped drain concentration of conductivity determining impurities than the heavily doped source concentration.

The gate 28 overlies the substrate 12 between the source 42 and drain 34, where the substrate 12 underling the gate 28 serves as the channel 62 of the transistor 64. The channel 62 may include conductivity determining impurities, where the conductivity determining impurities in the channel 62 are different than those in the source 42 and the drain 34. The concentration of the conductivity determining impurities in the channel 62 may be the same as that in the P-well 14 or the substrate 12. The transistor 64 includes the channel 62, the gate 28, the gate dielectric 30, the source 42 and the drain 34, where the transistor 64 is an electronic component. Some prior art high voltage transistors 64P include a drain 34 having two portions; a larger outer portion with a first concentration of conductivity determining impurities and a smaller inner portion with a second concentration of conductivity determining impurities, where the second concentration is higher than the first concentration (as illustrated in FIG. 1). In many embodiments, the second concentration is about the same as the heavily doped source concentration. The transistor 64 described herein does not include the smaller inner portion of the drain with a higher concentration of conductivity determining impurities than the larger outer portion of the drain, as described above. However, the transistor 64 described herein does include a lightly doped drain volume greater than a heavily doped source volume, where the lightly doped drain concentration is lower than the heavily doped source concentration, and the transistor 64 described herein is capable of operating with higher voltages than a transistor without a drain volume larger than the source volume and the lightly doped drain concentration lower than the heavily doped source concentration, as described above.

Many prior art transistors 64P (illustrated in FIG. 1) with a drain concentration that is about the same as a source concentration conduct electricity through the channel 62 by allowing movement of electrons, but some electronic components conduct electricity by the movement of holes (where a hole is an absence of an electron). An electronic component that conducts electricity by the simultaneous movement of electrons and holes in opposite directions is referred to as an ambipolar device, and ambipolar devices may be capable of operating at higher voltages and currents than devices that are not ambipolar. As such, an ambipolar device may be more resistant to damage from electrostatic discharge or other sudden flows of electricity than similar devices that are not ambipolar.

A schottkey diode is formed at the intersection of a metal (including a metal silicide) and a semiconductor, as mentioned above. As such, the physical contact between the drain conductor 52 and the lightly doped drain area 39 (with a lightly doped drain concentration of conductivity determining impurities) forms a Schottky diode, which has electrical characteristics similar to a pn diode. The channel 62 and the source 42 form another pn diode. As such, the source 42 to the drain conductor 52 forms a pnpn type device that is similar to a silicon controlled rectifier. The exemplary silicide of the drain conductor 52 as described herein provides holes for electrical conduction, and the source 42 provides electrons, so the transistor 64 and the drain 34 as described herein is an ambipolar device with simultaneous movement of holes and electrons. It has been discovered that the transistor 64 as described above is capable of operating at higher voltages than prior art transistors 64P that have higher drain concentrations at the drain semiconductor surface 60, such as devices that have a drain concentration about the same as the source concentration at the drain semiconductor surface 60. Exemplary embodiments of the transistor 64 described herein have been observed to withstand voltages of about +/−1,900 volts without damage to the transistor 64. Similar sized prior art transistors 64P with a drain concentration about the same as the source concentration at the drain semiconductor surface 60 may be damaged by voltages of about +/−100 volts or less. As such, the transistor 64 as described above may be used to mitigate damage from electrostatic discharges, as the transistor 64 is resistant to damage from sudden flows of electricity.

While at least one exemplary embodiment has been presented in the foregoing detailed description, it should be appreciated that a vast number of variations exist. It should also be appreciated that the exemplary embodiments are only examples, and are not intended to limit the scope, applicability, or configuration of the application in any way. Rather, the foregoing detailed description will provide those skilled in the art with a convenient road map for implementing one or more embodiments, it being understood that various changes may be made in the function and arrangement of elements described in an exemplary embodiment without departing from the scope, as set forth in the appended claims.

What is claimed is:
1. An integrated circuit comprising:
  a transistor comprising a source and a drain,
  wherein the source comprises a heavily doped source area comprising conductivity determining impurities,
  wherein the drain comprises a lightly doped drain area comprising conductivity determining impurities,
  wherein the lightly doped drain area is configured for a bipolar electrical conduction, and
  wherein the drain is free of a heavily doped drain area;
    a channel positioned between the heavily doped source area and the lightly doped drain area; and
    a gate overlying the channel, wherein the source comprises a minimum source concentration of conductivity determining impurities, and wherein the drain com- prises a maximum drain concentration of conductivity determining impurities that is less than the minimum source concentration.

2. The integrated circuit of claim 1 at least a portion of the lightly doped drain area directly underlies the gate and wherein no portion of the heavily doped source area directly underlies the gate.

3. The integrated circuit of claim 1 wherein the lightly doped drain area has a lightly doped drain volume, the heavily doped source area has a heavily doped source volume, and the lightly doped drain volume is greater than the heavily doped source volume.

4. The integrated circuit of claim 1 further comprising:
A drain conductor comprising a silicide, wherein the lightly doped drain area directly contacts an entire bottom surface of the drain conductor.

5. The integrated circuit of claim 4 wherein the heavily doped source area comprises electrically conductive material having a resistivity of about $1 \times 10^{-4}$ ohm meters or less.

6. The integrated circuit of claim 4 wherein the lightly doped drain area provides holes for electrical conduction and wherein the heavily doped source area provides electrons for electrical conduction.

7. An integrated circuit comprising:
a transistor that is free of a heavily doped drain area, wherein the transistor comprises:
a heavily doped source area comprising conductivity determining impurities at a heavily doped source concentration;
a lightly doped drain area comprising conductivity determining impurities at a lightly doped drain concentration, wherein the lightly doped drain concentration is less than the heavily doped source concentration;
a drain conductor directly contacting the lightly doped drain area;
a channel positioned between the heavily doped source area and the lightly doped drain area; and
a gate overlying the channel, wherein the transistor comprises a source and a drain, and the source comprises a minimum source concentration of conductivity determining impurities, and wherein the drain comprises a maximum drain concentration of conductivity determining impurities that is less than the minimum source concentration.

8. The integrated circuit of claim 7 wherein the transistor comprises a drain having a maximum drain concentration of conductivity determining impurities of about $1 \times 10^{15}$ per cubic centimeter.

9. The integrated circuit of claim 7 wherein the lightly doped drain area comprises electrically semiconductive material with a resistivity of from more than about $1 \times 10^{-4}$ ohm meters to less than about $1 \times 10^{4}$ ohm meters, and the heavily doped source area comprises electrically conductive materials with a resistivity of about $1 \times 10^{-4}$ ohm meters or less.

10. The integrated circuit of claim 7 wherein the heavily doped source area comprises a source depth and the lightly doped drain area comprises a drain depth, and wherein the source depth is from about 0.1 to about 0.9 times the drain depth.

11. The integrated circuit of claim 7 wherein a lightly doped drain volume is larger than a heavily doped source volume.

12. The integrated circuit of claim 7 wherein a transistor comprises the heavily doped source area, the lightly doped drain area, the channel, and the gate, and wherein the transistor is configured to withstand a voltage of from about −1,900 volts to about +1,900 volts.

13. The integrated circuit of claim 7 wherein the drain conductor comprises a silicide.

14. The integrated circuit of claim 7 wherein the heavily doped source concentration is from about $1 \times 10^{18}$ to about $1 \times 10^{21}$ per cubic centimeter, and the lightly doped drain concentration is from about $1 \times 10^{14}$ to about $1 \times 10^{15}$ per cubic centimeter.

15. The integrated circuit of claim 14 wherein the drain conductor comprises a drain semiconductor surface, wherein the drain conductor comprises a silicide, wherein the drain semiconductor surface is a surface of the drain conductor that physically contacts semiconductor material, and wherein all of the drain semiconductor surface directly contacts the lightly doped drain area.

16. The integrated circuit of claim 7 wherein the heavily doped source area comprises N-type conductivity determining impurities.

17. The integrated circuit of claim 16 wherein the channel comprises P-type conductivity determining impurities at a concentration of from about $1 \times 10^{15}$ to about $1 \times 10^{16}$ per cubic centimeter.

* * * * *